United States Patent
Chen

(10) Patent No.: US 7,458,844 B2
(45) Date of Patent: Dec. 2, 2008

(54) GROUNDING DEVICE FOR REDUCING EMI ON PCB

(75) Inventor: Chun-Hung Chen, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,403

(22) Filed: Aug. 4, 2006

(65) Prior Publication Data

US 2007/0077794 A1    Apr. 5, 2007

(30) Foreign Application Priority Data

Sep. 9, 2005    (CN)    .................. 2005 1 0037220

(51) Int. Cl.
*H01R 31/08*    (2006.01)
(52) U.S. Cl. .................................... 439/507
(58) Field of Classification Search ............. 439/507, 439/92, 91, 97; 174/384, 51; 365/753, 799
See application file for complete search history.

(56) References Cited

U.S. PATENT DOCUMENTS

| | | | | |
|---|---|---|---|---|
| 2,740,097 A | * | 3/1956 | Edelman et al. ............... | 439/75 |
| 3,762,040 A | * | 10/1973 | Burns et al. .................... | 29/593 |
| 4,962,585 A | * | 10/1990 | Kobayashi .................... | 29/885 |
| 5,262,596 A | * | 11/1993 | Kawakami et al. ........... | 174/261 |
| 5,357,051 A | * | 10/1994 | Hwang ........................ | 174/33 |
| 5,372,521 A | * | 12/1994 | Laudereau .................... | 439/507 |
| 5,389,743 A | * | 2/1995 | Simila et al. ................. | 174/262 |
| 6,024,586 A | * | 2/2000 | Kumagai ...................... | 439/95 |
| 6,181,571 B1 | * | 1/2001 | Sugimoto .................... | 361/799 |
| 6,215,076 B1 | * | 4/2001 | Inagawa et al. .............. | 174/261 |
| 6,262,887 B1 | * | 7/2001 | Lee ............................... | 361/683 |
| 6,329,714 B1 | * | 12/2001 | Guillot ........................ | 257/723 |
| 6,763,579 B2 | * | 7/2004 | Haba et al. ................... | 29/842 |
| 6,976,856 B2 | | 12/2005 | Peng et al. | |
| 6,994,586 B2 | * | 2/2006 | Kanehira .................... | 439/564 |
| 7,094,076 B2 | * | 8/2006 | Hatakeyama ................ | 439/97 |
| 7,282,932 B2 | * | 10/2007 | Kirby et al. .................. | 324/754 |
| 2006/0276063 A1 | * | 12/2006 | Guichard et al. ............. | 439/81 |

FOREIGN PATENT DOCUMENTS

CN    2475256 Y    1/2002
CN    2673032 Y    1/2005

* cited by examiner

*Primary Examiner*—Neil Abrams
(74) *Attorney, Agent, or Firm*—Wei Te Chung

(57) ABSTRACT

A grounding device for reducing electromagnetic interference (EMI) on a printed circuit board (PCB) includes a grounded portion formed on the PCB, a threaded hole defined in the PCB, and a connecting member. The grounded portion is a part of a grounding layer of the PCB and with high impedance. The threaded hole is grounded and with low impedance. The connecting member includes a first connecting tab and a second connecting tab separately formed at opposite ends thereof. The first connecting tab is electrically connected with the threaded hole via a screw. The second connecting end resiliently abuts against the grounded portion of the PCB.

8 Claims, 2 Drawing Sheets

GROUNDING DEVICE FOR REDUCING EMI ON PCB

FIELD OF THE INVENTION

The present invention relates to grounding devices for reducing electromagnetic interference (EMI), and particularly to a device which can efficiently reduce EMI on a printed circuit board (PCB).

DESCRIPTION OF RELATED ART

Today, EMI is a familiar problem in electronics, especially in PCB design. Generally speaking, most EMI problems can be solved by arranging enough grounding circuits on the PCB. Therefore, when designing a PCB, a grounded layer will be defined in the PCB for aiding in the reduction of EMI. The grounded layer efficiently reduces voltage dropping caused by noise. Thus EMI is reduced on the PCB. However, the grounded layer generally includes a plurality of vias defined therein. Many vias, each with its own impedance, close together in an area of the grounded layer are highly susceptible to EMI.

What is desired, therefore, is to provide a grounding device which can efficiently reduce EMI on a PCB.

SUMMARY OF THE INVENTION

In one preferred embodiment, a grounding device for reducing electromagnetic interference (EMI) on a printed circuit board (PCB) includes a grounded portion formed on the PCB, a threaded hole defined in the PCB, and a connecting member. The grounded portion is a part of a grounding layer of the PCB and with high impedance. The threaded hole is grounded and with low impedance. The connecting member includes a first connecting tab and a second connecting tab separately formed at opposite ends thereof. The first connecting tab is electrically connected with the threaded hole via a screw. The second connecting end resiliently abuts against the grounded portion of the PCB.

Other advantage and novel feature will become more apparent from the following detailed description when taken in conjunction with the accompanying drawings, in which:

DETAILED DESCRIPTION OF THE INVENTION

Figure 1:
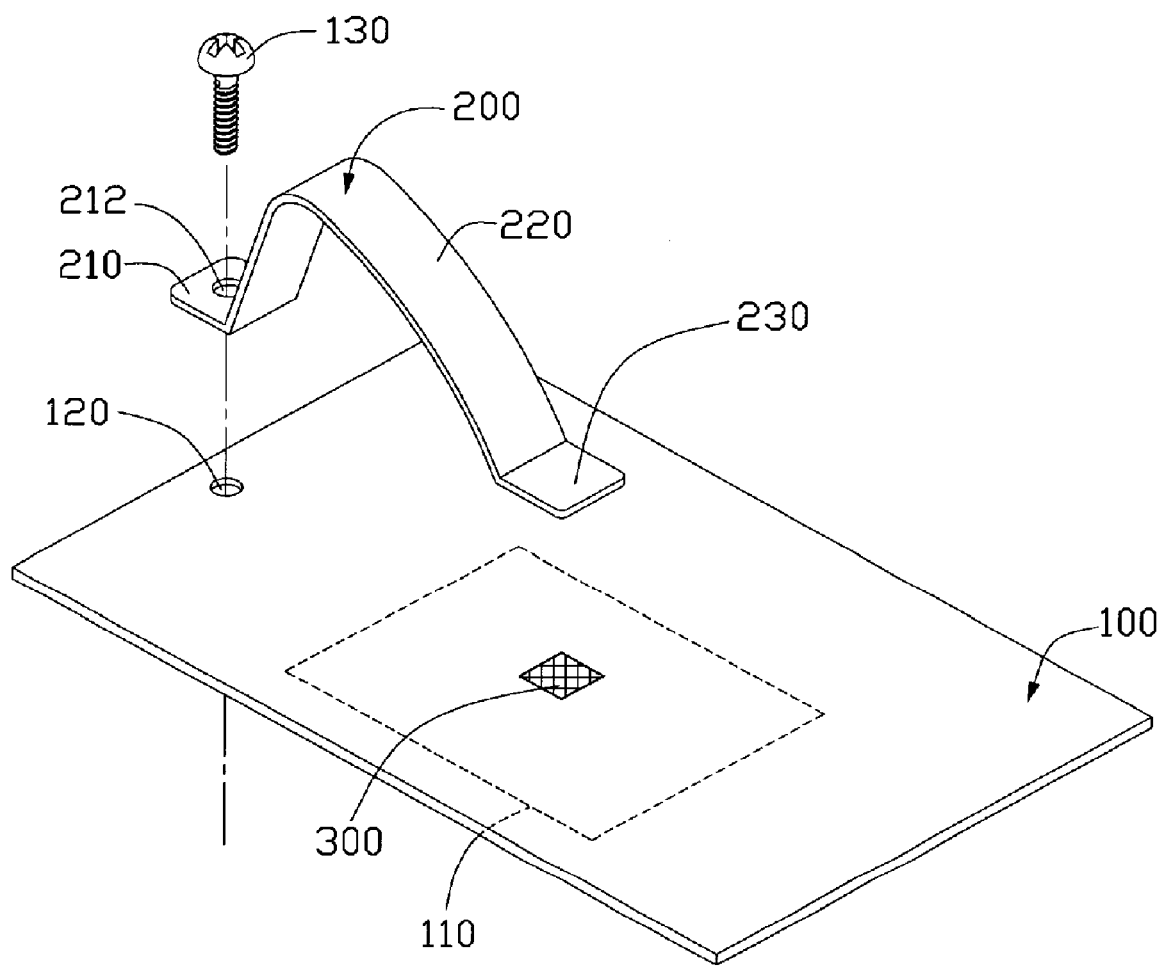
FIG. 1 is an isometric, exploded view of a grounding device in accordance with a preferred embodiment of the present invention together with a PCB.

Referring to FIG. 1, a grounding device according to a preferred embodiment of the present invention is provided to reduce EMI on a PCB 100 such as a motherboard. The grounding device includes a connecting member 200 with two opposite ends separately and electronically attached to the PCB 100. An area 110 is defined on the PCB 100. The area 110 is a part of a grounding layer of the PCB 100. This part has high impedance due to many vias defined therein or other reasons that can easily cause EMI. A grounded portion 300 (such as a copper grid or copper mesh) is exposed on the area 110. A threaded hole 120 is defined in a part with lower impedance of the PCB 100 and is also grounded.

The connecting member 200 is a resilient strip which is made of good conductive material. The connecting member 200 includes a main portion 220, a first connecting tab 210, and a second connecting tab 230. The main portion 220 has a curved configuration. The first connecting tab 210 and the second connecting tab 230 separately extend from opposite ends of the main portion 220. A through hole 212 is defined in the first connecting tab 210.

Figure 2:
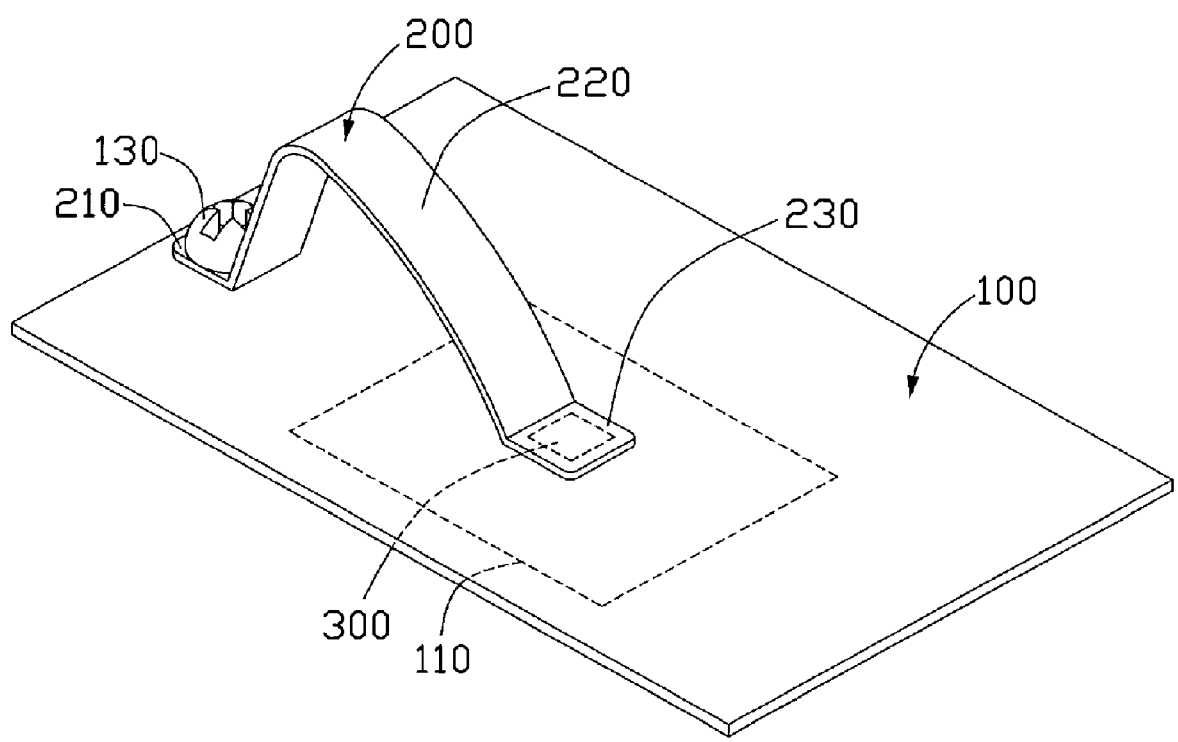
FIG. 2 is an assembled view of FIG. 1.

Referring to FIG. 2, the connecting member 200 is electronically attached to the PCB 100. A screw 130 is extended through the through hole 212 of the first connecting tab 210 and engages in the threaded hole 120 of the PCB 100. The second connecting tab 230 resiliently abuts against the grounded portion 300 of the PCB 100. The grounded portion 300, the threaded hole 120, and the connecting member 200 form a grounding circuit with low impedance away from areas with a high density of vias and/or impedence, thus avoiding adverse effects of EMI.

The connecting member 200 is coated with insulating materials to prevent short-circuits with other components of the PCB 100.

A shape and a size of the connecting member 200 can be varied according to different situations.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A grounding device for reducing electro magnetic interference (EMI) of a printed circuit board (PCB), the grounding device comprising:
    a first grounded portion of the PCB and having high impedance;
    a second grounded portion of the PCB and having low impedance; and
    a connecting member comprising a first end, and a second end, the first end electrically connected to the first grounded portion of the PCB, the second end electrically connected to the second grounded portion of the PCB;
    wherein the connecting member is a resilient strip, the connecting member comprises a main portion, a first tab, and a second tab, the first tab and the second tab extending from two opposite ends of the main portion, respectively; the second grounded portion is a grounded threaded hole defined in the PCB, the first tab of the connecting member defines a through hole therein, a screw is extended through the through hole and engages in the threaded hole.

2. The grounding device as claimed in claim 1, wherein the first grounded portion is a part of a grounding layer of the PCB, the second tab of the connecting member resiliently abuts against the second grounded portion.

3. The grounding device as claimed in claim 2, wherein the first grounded portion is an exposed copper portion of the grounding layer of the PCB, the second tab of the connecting member resiliently abuts against the first grounded portion.

4. The grounding device as claimed in claim 1, wherein the connecting member is made of conductive material.

5. The grounding device as claimed in claim 4, wherein the connecting member is coated with insulating material.

6. A printed circuit board (PCB) comprising:
    a first grounded area with high impedance;
    a second grounded area with low impedance; and
    a connecting member electronically connecting the first grounded area to the second grounded area;

wherein the connecting member is a resilient strip, the connecting member comprises a main portion with a curved configuration and two opposite ends, the first end and the second end separately extend from two opposite ends of the main portion; the second grounded area is a grounded threaded hole defined in the PCB, a through hole is defined in the first end of the connecting member, a screw is extended through the through hole and engages in the threaded hole.

7. The PCB as claimed in claim 6, wherein the first grounded area is a part of a grounding layer and comprises an exposed copper portion to electronically engage with the second end of the connecting member.

8. The PCB as claimed in claim 7, wherein the connecting member is made of conductive material and coated with insulating material.

* * * * *